United States Patent [19]

Trampert

[11] Patent Number: 5,059,912
[45] Date of Patent: Oct. 22, 1991

[54] METHOD AND APPARATUS FOR THE INTERTURN AND INTERLAYER FAULT TESTING OF COILS

[75] Inventor: Wolfgang Trampert, Baiersdorf, Fed. Rep. of Germany

[73] Assignee: Siemens Aktiengesellschaft, Berlin & Munich, Fed. Rep. of Germany

[21] Appl. No.: 474,353

[22] Filed: Feb. 2, 1990

[30] Foreign Application Priority Data

Feb. 15, 1989 [DE] Fed. Rep. of Germany ....... 3904554

[51] Int. Cl.[5] ............................................. G01R 31/06
[52] U.S. Cl. ...................................... 324/546; 324/654
[58] Field of Search .............................. 324/545–547, 324/726, 654

[56] References Cited

U.S. PATENT DOCUMENTS

| | | | |
|---|---|---|---|
| 3,267,370 | 8/1966 | Praeg | 324/547 X |
| 3,667,034 | 5/1972 | Freeze | 324/546 X |
| 3,753,087 | 8/1973 | Tan | 324/546 X |

FOREIGN PATENT DOCUMENTS 0910092 4/1954 Fed. Rep. of Germany .
2644253 9/1978 Fed. Rep. of Germany .

Primary Examiner—Jack B. Harvey
Attorney, Agent, or Firm—Kenyon & Kenyon

[57] ABSTRACT

A device having a first U-shaped core with an excitation winding and an additional U-shaped core with a measuring winding and a connected display device is configured such that an electric coil as a test piece winding can be wrapped around one of the arms of both U-shaped cores. The U-shaped cores and the yokes which close the cores consist of ferrite and have an air gap formed between the cores and the yokes. A voltage is induced in the winding coil by an excitation winding forming part of an exciting circuit. The stray field generated by a winding turn having an interturn fault, as a result of the short-circuit current flowing therein, induces a voltage in the measuring winding of the measuring curcuit. The measurement is performed at a variable frequency which results in a minimal voltage when the test piece is free from defects.

6 Claims, 5 Drawing Sheets

METHOD AND APPARATUS FOR THE INTERTURN AND INTERLAYER FAULT TESTING OF COILS

FIELD OF THE INVENTION

The invention relates to a method for testing electric coils (test piece) for interturn and/or interlayer faults and, more particularly, to the testing of coils by inducing a voltage in the coil, i.e., the test piece, by means of an excitation winding in an exciting circuit.

A voltage is induced in a measuring coil of the measuring circuit by the stray field generated by a coil turn having an interturn fault as a result of the short-circuit current flowing therein. Additionally, the invention relates to an apparatus for implementing the method. The apparatus includes a first U-shaped core having a base and two arms, one of the arms having an excitation winding. An additional U-shaped core having a measuring winding and a display device coupled thereto, are configured such that the winding to be tested can be wrapped around a respective arm from each U-shaped core. Both U-shaped cores can then be closed by a magnet yoke.

BACKGROUND OF THE INVENTION

In almost all cases today, coils for electrotechnical applications are wound during mass production. Because the wound enamel-insulated wires can exhibit defects, the occurrence of an interturn or even an interlayer fault cannot be overlooked. Interturn faults remaining undetected in the course of production can possibly cause long-term coil failure. Therefore, within the scope of quality assurance, it is necessary for the ready-wound coils to undergo a test for interturn and/or interlayer faults. Several measuring methods, following very diverse physical principles, can be used for this purpose.

In previous practice, customary measuring methods operate, for example, according to the principles of an a.c. voltage measuring bridge or an impulse voltage testing method. Measuring instruments produced according to these principles operate satisfactorily when the coils have only a small number of turns. However, when the coils have a larger number of turns, the prior known instruments prove unreliable due to the s parasitic coil capacitance or the minimal measuring effect caused by an interturn fault.

Due to the fact that increasingly higher demands are placed on coils, any interturn faults across a turn must be reliably detected. This is particularly true for coils having a very high number of turns. The measuring method must also be suitable for application in a flexible, large-scale coil production.

Prior known German Patent 910 092 discloses a device for testing short-circuited turns in a coil. The device includes two auxiliary coils, one of which is coupled to an alternating-current source and the other to a voltmeter. The auxiliary coils are magnetically coupled, preferably through two iron cores, to !he coil to be tested. One auxiliary coil hereto operates with industrial alternating current (50 Hz), whereby the voltmeter is supposed to be calibrated directly in the short-circuited turns.

Another known device for testing a winding for interturn or interlayer faults is described in German Printed Patent 26 44 253. This device discloses permitting an accurate testing for interturn or interlayer faults. The device is operable for windings having a very high number of turns. The device includes a first U-shaped core having an excitation winding around one of its arms. An additional U-shaped core has a measuring winding around one of its arms which is coupled to a display device. The winding to be tested can be wrapped around the adjacent other arm of both U-shaped cores. In a first specific embodiment, an auxiliary winding is superimposed on both U-shaped cores. An adjusting device, which is adjustable with respect to the phase relation of a delivered current, is coupled to the auxiliary winding. In this embodiment, the current must be manually adjusted in proportion to the test piece such that for a standard winding, the display device shows the value zero. In a second specific embodiment, the auxiliary winding is dispensed with, provided that the measuring device itself is phase-sensitive. In both cases, however, it is necessary to select the lowest possible measuring frequency to guarantee adequate specificity.

In the German Printed Patent 26 44 253, the current adjustment depends on the type of coil and thus essentially can only be performed manually. The accuracy of the adjustment thereby influences the measuring result. As a result, in practice, more work and control are required to perform the test.

There is therefore needed a method and corresponding device for performing the winding test without requiring any manual adjustment steps, or alternatively where a phase-sensitive measuring device is not required.

SUMMARY OF THE INVENTION

The present invention meets the needs of the prior art. The invention relates to a method for testing coils for interturn and/or interlayer faults and, more particularly, to the testing of coils by inducing a voltage in the coil, i.e., the test piece, by means of an excitation winding in an exciting circuit. A voltage is induced in a measuring coil of the measuring circuit by the stray field generated by a coil turn having an interturn fault as a result of the short-circuit current flowing therein. Additionally, the invention relates to an apparatus for implementing the method. The apparatus includes a first U-shaped core having a base and two arms, one of the arms having an excitation winding. An additional U-shaped core having a measuring winding and a display device coupled thereto, are configured such that the winding to be tested can be wrapped around a respective arm from each U-shaped core. Both U-shaped cores can then be closed by a magnet yoke. The measurement is performed at a frequency resulting in a minimal voltage whenever the test piece is free from defects.

Using the present invention, it can be established that at a selected frequency, depending upon the type of coil, the stray field emanating from the excitation coil on the one hand, and the stray field created by the interturn capacitance of the test piece on the other hand, compensate each other in the measuring coil. Because the component in the stray field of the test piece, resulting from an interturn fault, cannot be compensated by the stray field of the excitation coil, the absolute value of the minimal voltage clearly increases in the case of the frequency selected according to the present invention. Therefore, by evaluating this voltage, a definite statement can be made concerning the existence of an interturn and/or interlayer fault.

The U-shaped cores and the magnet yokes (which close the cores) are advantageously made of a ferrite material. An air gap is formed between both of the U-shaped cores and between the yokes and the U-shaped cores, respectively. The latter is generally known in connection with state-of-the-art iron cores. However, only with such a design is it possible to measure when there are varying frequencies, e.g., frequencies in the range between 500 Hz and 100 kHz and thus to achieve the desired effect of the specific stray field.

An advantage of the present invention is that the test procedure can be automated with a suitable designed measuring system. In particular, the appropriate measuring frequency is fully automatically selected with a personal computer operating appropriately developed software.

In the present invention, it is no longer necessary that physical contact be made With the test piece. The method and apparatus make it possible to reliably detect interturn faults across a single turn, even in coils having over 35,000 windings. The required testing time is thereby approximately 2.5 seconds. Depending upon the stringency of the test and the appropriateness of the personal computer selected and used for the evaluation, the testing time can be further reduced to approximately 1 second.

DETAILED DESCRIPTION

The method of the present invention is a modified strayfield measuring method wherein the coil to be tested, i.e., test piece, is placed in a generally known manner between two magnetic circuits. An excitation coil or transmitting coil forms part of the first circuit and a measuring coil forms part of the second circuit. The following effects are thereby utilized: The magnetic field emanating from the transmitting coil, to which is coupled an a.c. voltage source, induces a voltage in the test piece; at the same time, a stray field emanates from the transmitting coil; this stray field also generates a voltage in the measuring coil. If the frequency of excitation increases, then the parasitic coil capacitance of the test piece becomes more and more noticeable. Therefore, a current flows in a test piece (even when free from defects), which in turn produces a magnetic field. However, at a specific frequency, the stray fields resulting from the transmitting and test coils compensate each other. At this frequency, the voltage in the measuring coil attains its minimum value. This frequency is then selected as the measuring frequency. If there is an interturn fault in the test coil, then a magnetic field emanates from the short-circuit current flowing in this turn. This magnetic field creates an active component in the stray field of the test piece. The latter active component, however, cannot be compensated by the stray field of the excitation coil. Therefore, an interturn fault in the test piece increases the value of the minimal voltage, which value is induced in the measuring coil at the above described frequency. The evaluation of this voltage gives evidence of whether an interturn fault exists.

Figure 1:
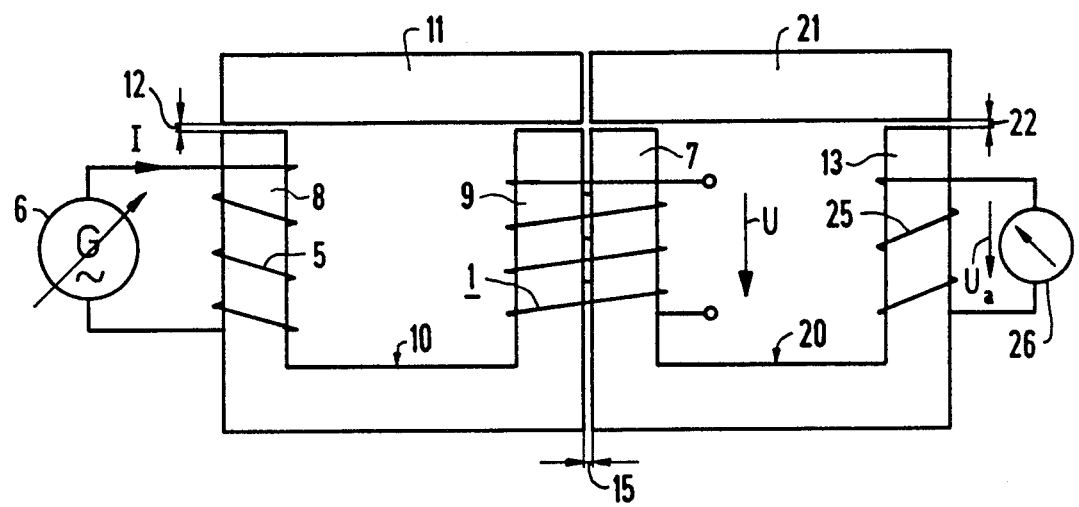
FIG. 1 illustrates the design of both magnetic circuits required for the test of the present invention.

The measuring configuration according to FIG. 1 consists of two U-shaped cores 10 and 20 having respective arms 8, 9 and 7, 13. Each of the U-shaped cores form, with a corresponding yoke 11 or 21, a closed magnetic circuit. The U-shaped cores 10, 20 and the corresponding yokes 11, 21 consist of ferritic material which makes it possible to operate the invention at any frequency. As a core material, however, ferrite is mechanically not very stressable. Therefore, air gaps 12, 22 are formed between the U-shaped cores 10 and 20 and the yokes 11 and 21. This has the advantage of preventing dust and dirt particles, which tend to settle between the yoke and the core, from adversely affecting the results of the measurement. With increasing air gap length, the error parameter $\alpha$, defined as the ratio of the measuring voltage of a coil with an interturn fault to a coil without an interturn fault ($\alpha = U_{mw}/U_m$), decreases. Therefore, it is practical to select the smallest possible air gap. An air gap of 0.2 mm is preferable.

The clearance 15 between the two U-shaped core arms 9, 7 facing each other can be varied. The spacing is selected as a function of the dimensions of the test piece. A test piece 1 is slid over the adjacent arms 9, 7.

An excitation coil 5, coupled to a generator 6 having a predeterminable frequency, is situated on an arm 8 of the first U-shaped core 10. A measuring coil 25, coupled to a voltmeter 26, is situated on an arm 13 of the second U-shaped core 20.

Figure 2:
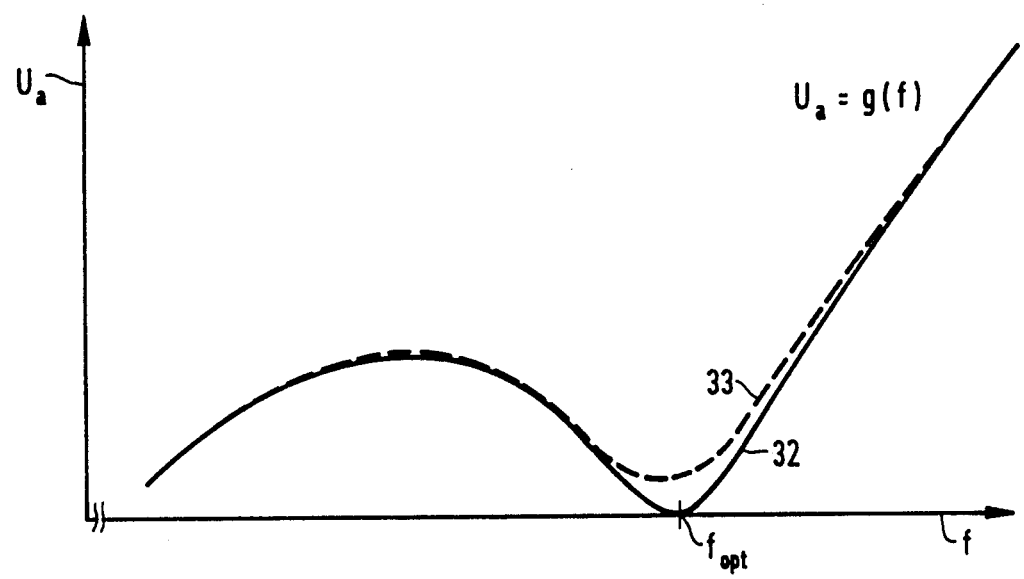
FIG. 2 is a diagram plotting the measurements made in FIG. 1 to show the selection of the measuring frequency.

When the frequency is varied in the device of FIG. 1, the response signal is measured. A curve can be produced as a function of the measuring frequency. The qualitative progression of this curve is depicted in FIG. 2. The signal $U_a = g(f)$ is plotted with the measuring voltage $U_a$ as the ordinate and the frequency f as the abscissa, in any arbitrary units. It is recognized that the signal $U_a = g(f)$ as shown by curve 32 varies with the frequency. However, at a specific value, the curve passes through a minimum value. This frequency depends upon the type of test piece and can lie in the range between 500 Hz and 100 kHz. The curve 33 shows the output voltage $U_a$ for a test piece encumbered with an interturn fault.

From theoretical considerations, it can be inferred that the stray field emanating from the excitation coil and the stray field of the test piece 1 created by the interturn capacitance compensate each other in the measuring coil. This occurs when an arbitrary coil is used as a test piece and is a function of the coils inductance L and capacitance $C_L$, on the one hand, and the geometric proportions of the measuring device on the other hand. The extent of the variations of the inductance L and coil capacitance $C_L$ depend upon the unavoidable tolerance of the number of turns, the coil member dimensions and the strength of the wire. Therefore, it is seen that the measuring frequency is also dependent on the test piece. Since the mentioned tolerance ranges can be determined, the optimum measuring frequency lies in a predeterminable measuring frequency range. Provided that the core geometry remains constant, a suitable measuring frequency range results thereby solely as a function of the test piece. At this point, because the measurement takes place within a measuring frequency range and the value of the minimal voltage is evaluated in this frequency range, the measurements are guaranteed to be made independently of the test piece tolerances at the frequency which is optimum for the respective, coupled test piece. Further adjustments are not necessary.

Figure 3:
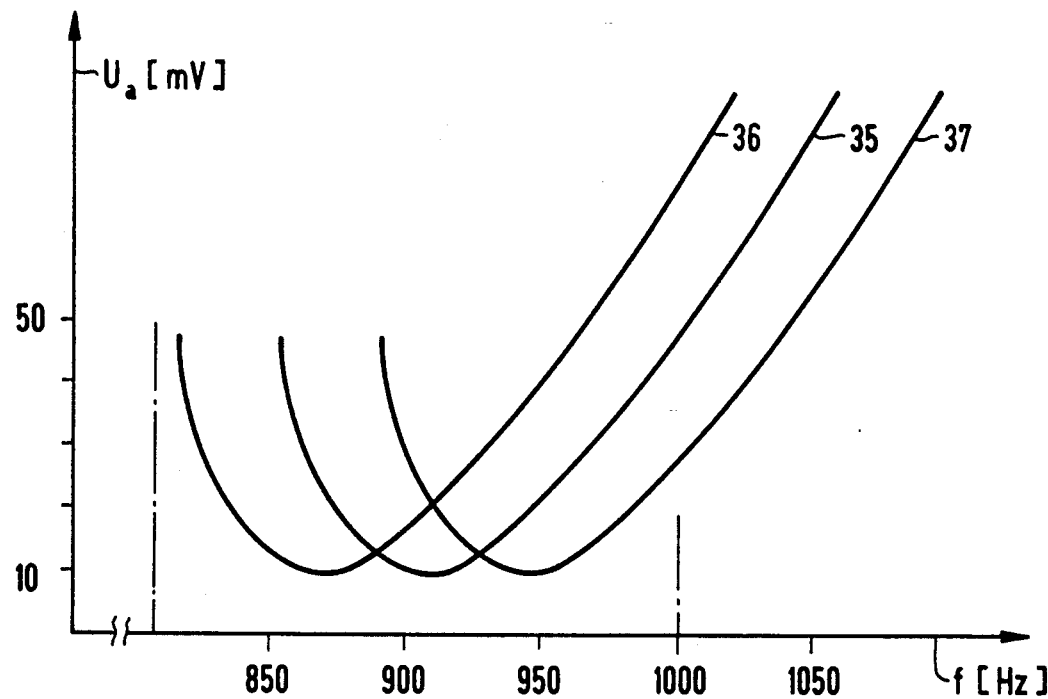
FIG. 3 is an enlarged view of a portion of FIG. 2 for a specific coil type.

FIG. 3 is an enlarged portion from FIG. 2 showing the plotted curves for a coil of a special type having a large number of turns n, e.g., n=30,000. In this case, the minimum value for the normal coil lies at approximately f=910 Hz as shown by curve 35. This represents the optimum measuring frequency, $f_{opt}$. If the inductance L or capacitance $C_L$ of the test piece 1 becomes greater, $f_{opt}$ shifts to lower frequencies corresponding to curve 36; if L or $C_L$ become smaller, then $f_{opt}$ shifts to higher frequencies corresponding to curve 37. In both cases, however, the absolute value of the minimum remains. However, when an interlayer and/or interturn fault occurs, the minimum absolute value of the voltage U a-so changes as shown by curve 33 of FIG. 2. Therefore, the measuring frequency range extends, in conformance with the example, from approximately 800 to 1000 Hz.

The curves 36 and 37 in FIG. 3 represent limiting values for the minimum and maximum inductance and capacitance, respectively. All coils of the type mentioned above, found in general practice lie within the range of these limiting curves.

Because it is possible for different effects to overlap, for a batch testing run, the optimum measuring frequency must first be determined on a normal coil coming closest to the test piece type. The measuring frequency is then varied during the measurement. At the same time, the output voltage is measured and the value of the minimal voltage is evaluated respectively. In the optimum measuring range, the absolute value of the measuring voltage minimum is then used to clearly indicate if an interturn fault exists.

With the measuring apparatus set-up shown in FIG. 1, however, it is possible that a partial field from the excitation coil 5 will intersperse directly into the measuring coil 25. To minimize this interference effect, it is advantageous to arrange the magnetic field of the excitation coil 5 perpendicularly to the magnetic axis of the measuring coil. This is done so that for physical reasons, as a result of the direct interference by a magnetic field of the excitation coil, no voltages can be induced in the measuring coil. For this purpose, the U-shaped cores must be geometrically designed in a manner which will allow one of the two U-shaped cores 10 or 20 to be transposed accordingly.

Figure 4:
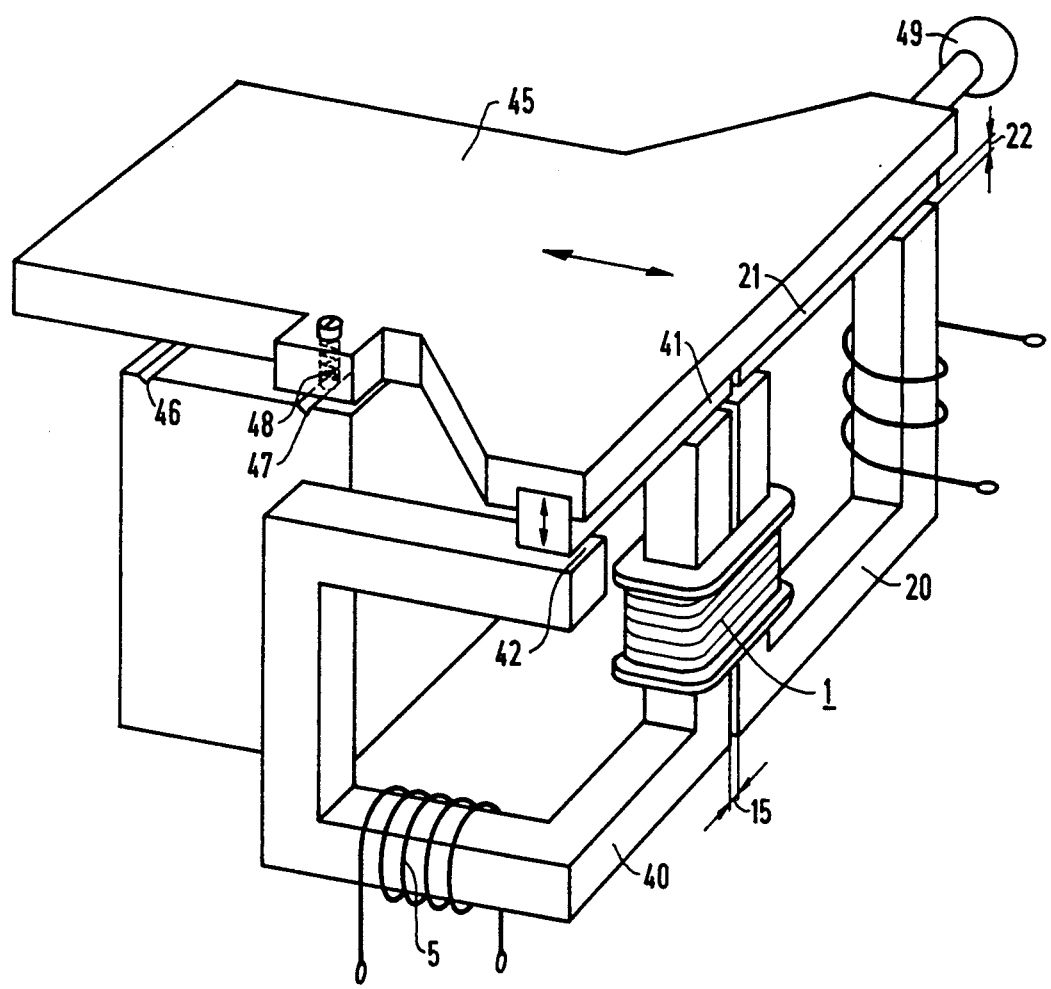
FIG. 4 is a perspective view of an advantageous modification of the magnetic circuit according to FIG. 1.

Referring to FIG. 4, there is shown a U-shaped core 40 with a yoke 41. The arm having the exciting circuit 5 is bent at an angle of 90° with respect to the measuring coil. Apart from that difference, the measurement set-up is identical to that of FIG. 1.

During batch testing of coils having a measurement set-up according to either FIG. 1 or FIG. 4, it is necessary to open the yokes 11, 21 and 41 across the U-shaped cores 10, 20 and 40, respectively. After the test piece is inserted, the yokes 11, 20, 40 are closed as determined. For this purpose, a slide 45 is provided with an interlocking device which can be locked into two predeterminable positions 46 or 47 by means of ball notches. The slide 45 is coupled to the base plate of the device and allows the two yokes 21 and 41 to slide across the U-shaped bars from the first position 46 into the second position 47. The yokes 21, 41 are fixed in position by stop mechanisms 48. During the batch testing, the operation of the device is simplified by an actuating lever 49.

Figure 5:
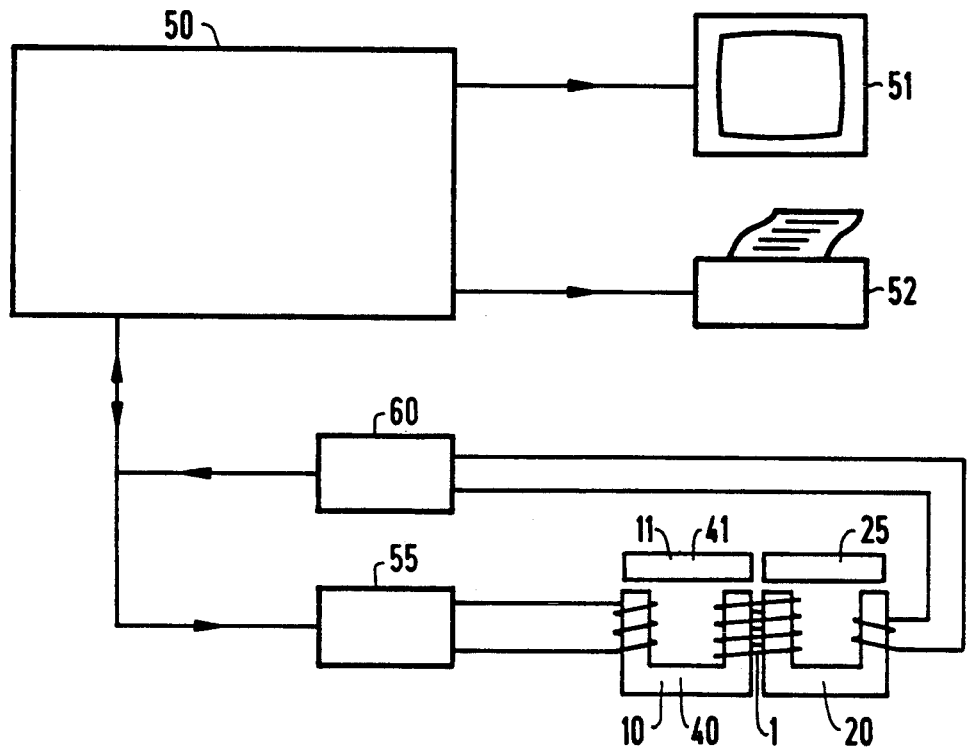
FIG. 5 is a block diagram of the entire measuring system using a personal computer which handles the sequencing control for the measuring operation and also evaluates the measuring data.

Referring to FIG. 5, a device of the invention is shown coupled in a measuring system consisting essentially of a personal computer (PC) 50. The PC 50 includes corresponding peripherals, such as a monitor 51 and a printer 52, as well as a variable-frequency oscillator 55 and a digital multimeter 60 functioning as a voltmeter. The oscillator 55 is used to synthesize variable-frequency voltages and is controlled during the measurements by the PC 50.

Using an appropriate software input, the test sequence is controlled so as to allow the optimum measuring parameters on the coupled equipment to be adjusted. After the measuring operation begins, the PC 50 takes over the function of recording and evaluating the measured values and finally displays the end result on the monitor 51 or printer 52. Besides processing the measured values, the PC 50 can also store the defined nominal values. A statistical evaluation of the measured values is also possible for mass production purposes.

Figure 6:
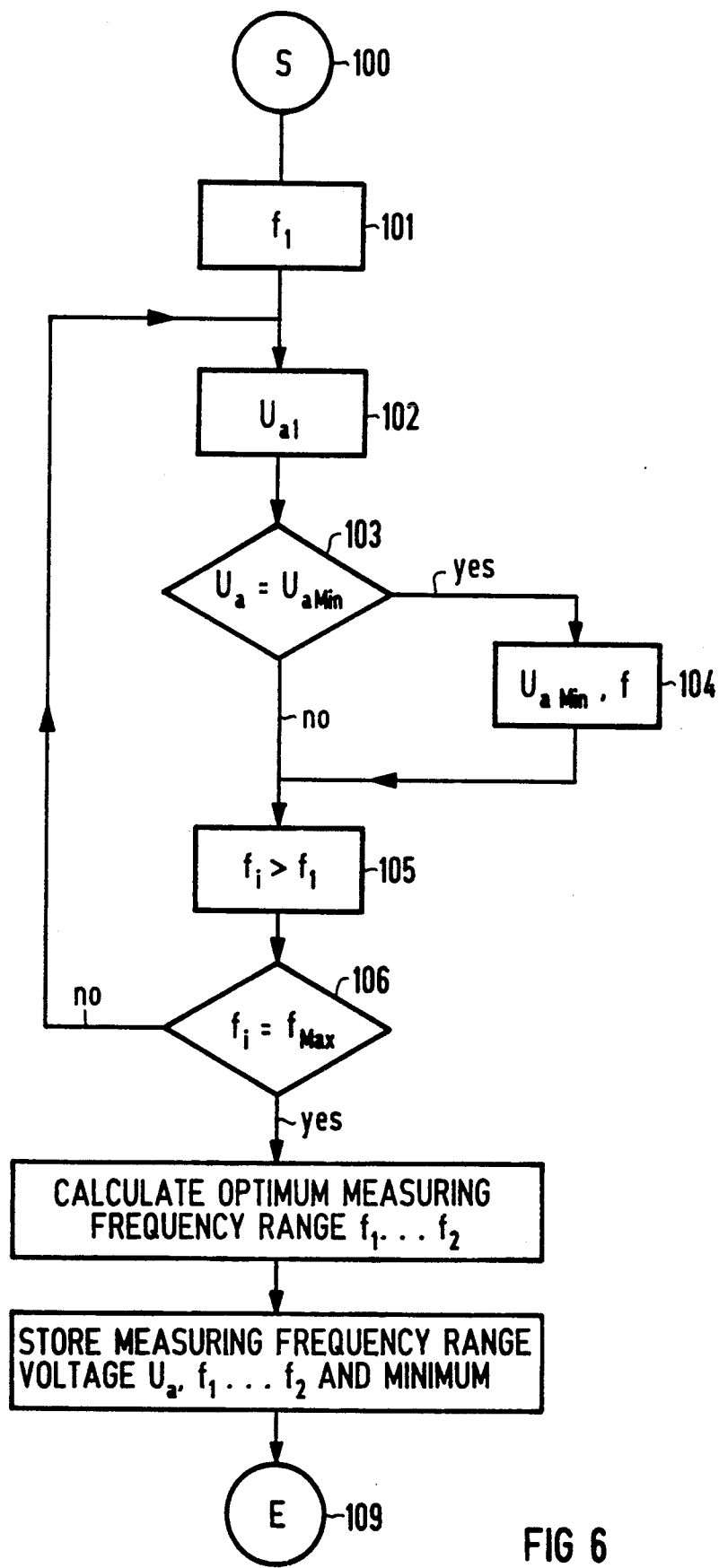
FIG. 6 is a flow chart describing the fully automatic determination of the measuring parameters.
Figure 7:
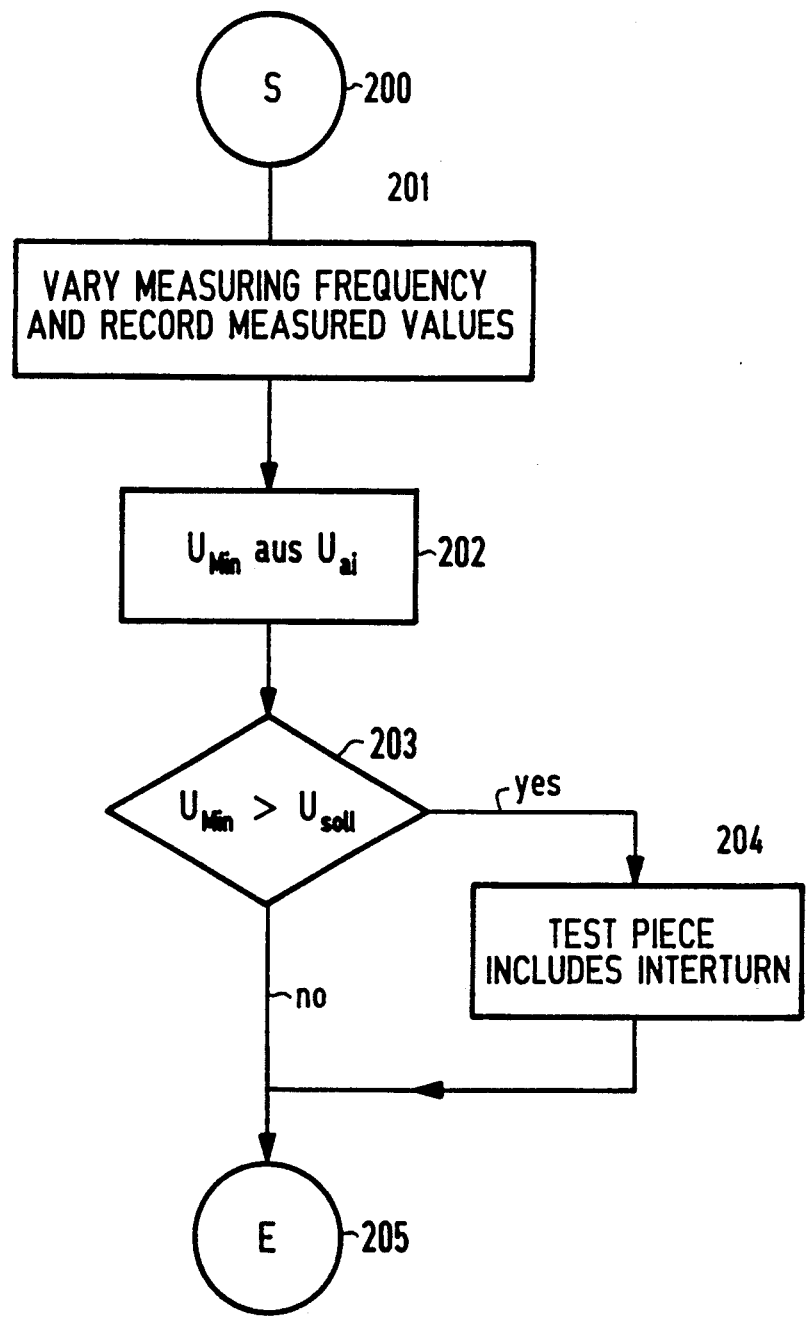
FIG. 7 is a flow chart describing the batch testing.

The interturn fault test is described with reference to the flow charts in FIG. 6 and FIG. 7. FIG. 6 shows the non-recurrent and automatic calculation of the optimum measuring parameters. In comparison, FIG. 7 shows the actual measuring sequence implemented for every test piece in a series production. As is customary, sequence steps are identified with rectangles and decision steps with diamonds.

The flow chart in FIG. 6 begins with the assumption that the frequency limits, i.e., the lowest measuring frequency (500 Hz) or the highest measuring frequently (100 kHz) are specified for the specific test piece type. After starting (shown by position 100) the transmitting coil with the lowest measuring frequency f1 is excited in sequence step 101. Subsequently in step 102, the voltage on the measuring coil is picked up and a test is made in decision step 103 of whether the detected voltage is the minimum value sought after. If this is not the case, then the measuring frequency is increased (position 105). If, on the other hand, the detected voltage is the minimum sought, then the adjusted actual measuring frequency and the minimum voltage value $U_{amin}$ are retained in the PC memory and the measuring frequency is likewise increased—as in the first case.

After the measuring frequency is increased, a test is made in decision step 106 if the maximum frequency is attained. If it is not attained, then the program again reverts back to position 103 and the corresponding loop is processed. If, on the other hand, the maximum frequency is reached, then in accordance with sequence step 107 having the stored measuring frequency and the corresponding voltage values, an optimum range is calculated having measuring frequencies from f1 to f2. Then, in accordance with sequence step 108, this measuring frequency range is saved, along with the corresponding minimum voltage, as the nominal values. At position 109, the first partial sequence ends.

The measuring sequence shown in FIG. 7 begins at position 200. At sequence step 201, the measuring frequency is continuously increased from f1 to f2. At the same time, the corresponding measured values are recorded, respectively. In sequence step 202, the minimum value is determined from the recorded measured values and, in the decision step 203, the calculated minimum value is compared to the specified nominal value. If the measured value is greater than the nominal value, it is determined that an interturn fault exists (step 204). At position 205, the measuring operation ends.

Batch testing of the coils, according to the flow chart of FIG. 7, can easily be effected by changing the software. In any case, the user of the device is directly informed at the PC monitor 51 of the coil quality and the possible existence of an interturn fault.

Due to the fact that the measuring operation is fully automatic, the batch testing of coils can also be easily performed by untrained personnel. Because no high voltages occur on the test piece, the time and labor expended for design safety can be kept to a minimum. The unavoidable manufacturing tolerances of the test coils have no influence on the measuring result in the present invention. Further, each test piece is tested at its optimum measuring parameters. This is accomplished while keeping the measuring time short.

Further, because a PC is used to control the test sequence, all resulting measured values can easily undergo a statistical evaluation.

What is claimed is:

1. A method for testing an electric coil for interturn and interlayer faults, wherein the electric coil to be tested is from a known type of coil and is a test piece in the method, the method comprising the steps of:
    a) inducing a first induced voltage in said test piece by using an excitation winding which forms part of an excitation circuit;
    b) generating a stray magnetic field in the test piece, if the test piece has an interturn fault, wherein the stray magnetic field results from a short circuit current flowing in the test piece caused by said first induced voltage;
    c) inducing a second induced voltage in a measuring coil, which forms part of a measuring circuit, wherein the second induced voltage is induced by said stray magnetic field; and
    d) performing steps a), b) and c) at a measuring frequency selected such that the second induced voltage in the measuring coil is at a minimum voltage value when the test piece is free of interlayer and interturn faults, an interlayer or interturn fault being detected when the second induced voltage in the measuring coil is greater than the said minimum voltage value when measured at the selected measuring frequency.

2. The method according to claim 1, further comprising a step of selecting the measuring frequency as a function of a length of an air gap in the excitation circuit and the measuring circuit, and as a function of an inductance and a capacitance of said test piece.

3. The method according to claim 2 wherein said step of selecting comprises a step of determining an optimum measuring frequency using a standard coil which approximates said test piece, said optimum frequency lying within a measuring frequency range.

4. The method according to claim 3 further comprising the steps of:
    varying the measuring frequency;
    simultaneously recording the voltage of the measuring coil; and
    evaluating the value of the minimal voltage of said measuring coil as an indication of the condition of the test piece.

5. The method according to claim 4 further comprising the step of comparing the value of the minimal voltage of said measuring coil indicating the condition of the test piece to the minimal voltage detected at said measuring coil when said standard coil is substituted for said test piece.

6. The method according to claim 3 wherein said step of determining the optimum measuring frequency range is determined from a frequency spectrum between approximately 500 Hz and approximately 100 kHz.

* * * * *